(12) United States Patent
Byom et al.

(10) Patent No.: US 8,341,500 B2
(45) Date of Patent: Dec. 25, 2012

(54) DETECTING CORRUPTED DATA FOR A SYSTEM HAVING NON-VOLATILE MEMORY

(75) Inventors: Matthew Byom, Campbell, CA (US); Daniel J. Post, Cupertino, CA (US); Vadim Khmelnitsky, Foster City, CA (US); Nir J. Wakrat, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 301 days.

(21) Appl. No.: 12/872,884

(22) Filed: Aug. 31, 2010

(65) Prior Publication Data

US 2012/0054582 A1    Mar. 1, 2012

(51) Int. Cl.
*G11C 29/00* (2006.01)
(52) U.S. Cl. .................. 714/773; 714/763; 365/185.33; 375/286
(58) Field of Classification Search .................. 714/763, 714/773; 365/185.33; 375/286
See application file for complete search history.

(56) References Cited

U.S. PATENT DOCUMENTS 7,924,628 B2 *    4/2011    Danon et al. ............. 365/185.28

* cited by examiner

*Primary Examiner* — Sam Rizk
(74) *Attorney, Agent, or Firm* — Kramer Levin Naftalis & Frankel LLP (57) ABSTRACT

Systems, apparatuses, and methods are provided for detecting corrupted data for a system having non-volatile memory, such as NAND Flash memory. In some embodiments, a non-volatile memory ("NVM") package is provided, which can include a NVM controller and one or more NVM dies. Each NVM die can include one or more blocks, where each block can further include an array of memory cells. One or more of these memory cells can be configured as "multi-level cells" ("MLCs"). In some embodiments, in order to avoid transmitting data obtained from an improperly programmed page of a MLC, a NVM controller can be configured to detect if data obtained from the page is in fact data stored in a different page.

25 Claims, 8 Drawing Sheets

DETECTING CORRUPTED DATA FOR A SYSTEM HAVING NON-VOLATILE MEMORY

BACKGROUND OF THE DISCLOSURE

NAND flash memory, as well as other types of non-volatile memories ("NVMs"), are commonly used in electronic devices for mass storage. For example, consumer electronics such as portable media players often include flash memory to store music, videos, and other media.

Conventional NVMs may include arrays of memory cells composed of floating gate transistors. To increase the storage capacity of a NVM while maintaining a small NVM size, some NVMs may store multiple bits of data in each memory cell. Such memory cells are commonly referred to as "multi-level cells" ("MLCs"). For example, a multi-level memory cell that is capable of storing 2 bits of data (e.g., a 2-bit memory cell) can include both a lower page and an upper page.

A multi-level cell can be programmed in stages. For example, for a 2-bit memory cell, the lower page of the memory cell can be programmed first. Once the lower page has been programmed, the upper page of the memory cell can be programmed. In addition, in order to read a programmed 2-bit memory cell, each of the lower and upper pages can be read separately.

Sometimes, however, a power loss event may interrupt the programming of a memory cell. For example, a power loss event can occur after the lower page of a memory cell has been programmed, but before the upper page of the memory cell has been fully programmed. This may result in an improperly programmed upper page.

When power is later restored, a system may attempt to read data from the memory cell. Conventionally, a state bit can be used to keep track of the last programmed memory cell, which can allow the system to handle the memory cell as an erased memory cell. In some situations, however, the value of the state bit can become unreliable, thereby causing the system to inadvertently use corrupted data obtained from an upper page of the memory cell. As used herein, "corrupted data" can refer to data obtained from a memory location of a NVM that is actually data stored in a different memory location of the NVM (e.g., lower page data obtained from an upper page of the memory cell).

SUMMARY OF THE DISCLOSURE

Systems, apparatuses, and methods are provided for detecting corrupted data for a system having non-volatile memory ("NVM"), such as NAND Flash memory. In order to prevent the transmission of corrupted data, a NVM controller of a system can be configured to detect if data obtained from an upper page of a memory cell is in fact data stored in a different page of the NVM. If the obtained data is data stored in a different page of the NVM, the NVM controller can handle the data as uncorrectable ECC ("uECC") data.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Systems, apparatuses, and methods for detecting corrupted data for a system having non-volatile memory ("NVM") are provided. In order to prevent the transmission of corrupted data, a NVM controller can be configured to detect if data obtained from an upper page of a memory cell is in fact data stored in a different page. This way, the system can protect against situations when an upper page becomes improperly programmed due to a power loss event.

In particular, if the NVM controller detects that the data obtained from an upper page is upper page data, the NVM controller can determine that the data is uncorrupted data that was previously programmed in the upper page. If, however, the NVM controller detects that the data is not upper page data, the NVM controller can determine that the data is corrupted data that was previously programmed in another memory location of the NVM (e.g., a lower page of the memory cell). The NVM controller can therefore handle the data as uncorrectable ECC ("uECC") data.

The NVM controller can use any suitable technique(s) to detect if data read from an upper page of a memory cell is corrupted. In some embodiments, the NVM controller can leverage metadata that is already being stored in the NVM. As used herein, "metadata" can include any suitable type of memory management data, which can be used to manage the storage of user data. For example, the NVM controller can direct an encryption module to perform a transform on metadata that is stored in an upper page, where an input of the transform can be based at least in part on a physical page address of the upper page. After the transform has been performed on the metadata, the NVM controller can determine whether an output of the transform corresponds to one or more excepted outputs.

In other embodiments, a NVM controller can explicitly allocate space in the metadata of a page to identify whether the page is a lower page or an upper page. That is, the NVM controller can embed a value in the metadata, where the value can be derived from the physical page address of the page. In one embodiment, for example, the NVM controller can program at least a portion of the physical page address into one or more metadata fields. In another embodiment, if the NVM controller is able to determine whether a page is a lower or upper page based on its physical page address, the system may only need to set a single bit of the metadata in order to identify the page.

Figure 1:
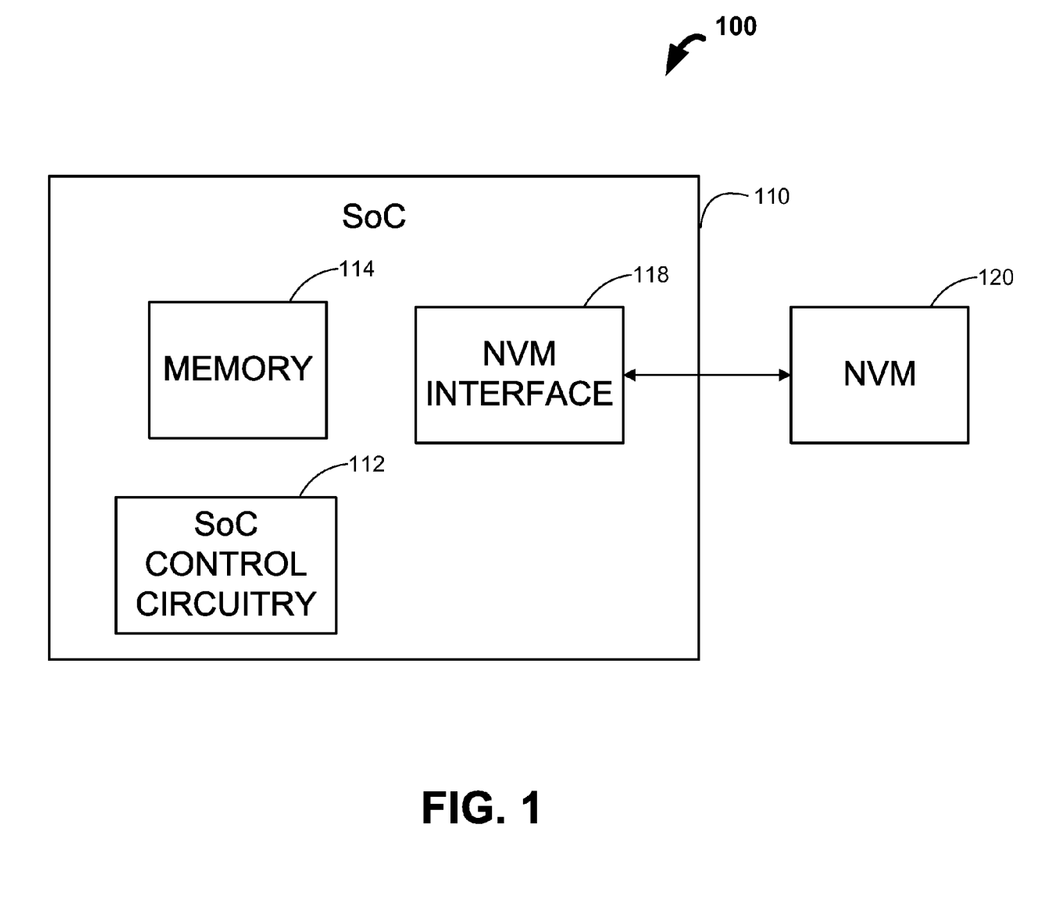
FIG. 1 is an illustrative block diagram of an electronic device configured in accordance with various embodiments of the invention.

FIG. 1 illustrates a block diagram of electronic device 100. In some embodiments, electronic device 100 can be or can include a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, a laptop computer, and any other suitable type of electronic device.

Electronic device 100 can include system-on-a-chip ("SoC") 110 and non-volatile memory ("NVM") 120. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), or any combination thereof.

NVM 120 can be organized into "blocks", which is the smallest erasable unit, and further organized into "pages", which can be the smallest unit that can be programmed or read. In some embodiments, NVM 120 can include multiple integrated circuits, where each integrated circuit may have multiple blocks. The blocks from corresponding integrated circuits (e.g., blocks having the same position or block number) may form "super blocks." Each memory location (e.g., page or block) of NVM 120 can be referenced using a physical address (e.g., a physical page address or physical block address).

Physically, a block in NVM 120 can include an array of memory cells aligned in rows corresponding to "word lines". The memory cells of a block may be configured as single-level cells ("SLCs") or multi-level cells ("MLCs"), and each word line in the block may be configured for use in storing one page (in a SLC case) or multiple pages (in a MLC case). Thus, the number of pages in a given block may be based on the number of bits stored per memory cell. Due to the increased density of storage, a block being used as a 2-bit MLC block may include twice the number of pages as when the same block is being used as an SLC block.

System-on-a-chip 110 can include SoC control circuitry 112, memory 114, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write commands to NVM interface 118 to obtain data from or store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile or non-volatile memory, such as random access memory ("RAM") (e.g., static RAM ("SRAM"), dynamic random access memory ("DRAM"), synchronous dynamic random access memory ("SDRAM"), double-data-rate ("DDR") RAM), cache memory, read-only memory ("ROM"), or any combination thereof. Memory 114 can include a data source that can temporarily store user data for programming into or reading from non-volatile memory 120. In some embodiments, memory 114 may act as the main memory for any processors implemented as part of SoC control circuitry 112.

NVM interface 118 may include any suitable combination of hardware, software, and/or firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, integrated circuits) of NVM 120 and the data stored therein (e.g., user data). For example, NVM interface 118 can interpret the read or write commands from SoC control circuitry 112, perform wear leveling, and generate read and program instructions compatible with the bus protocol of NVM 120.

While NVM interface 118 and SoC control circuitry 112 are shown as separate modules, this is intended only to simplify the description of the embodiments of the invention. It should be understood that these modules may share hardware components, software components, or both. For example, SoC control circuitry 112 may execute a software-based memory driver for NVM interface 118.

In some embodiments, electronic device 100 can include a target device, such as a flash memory drive or SD card, that includes NVM 120 and some or all portions of NVM interface 118. In these embodiments, SoC 110 or SoC control circuitry 112 may act as the host controller for the target device. For example, as the host controller, SoC 110 can issue read and write requests to the target device.

Figure 2:
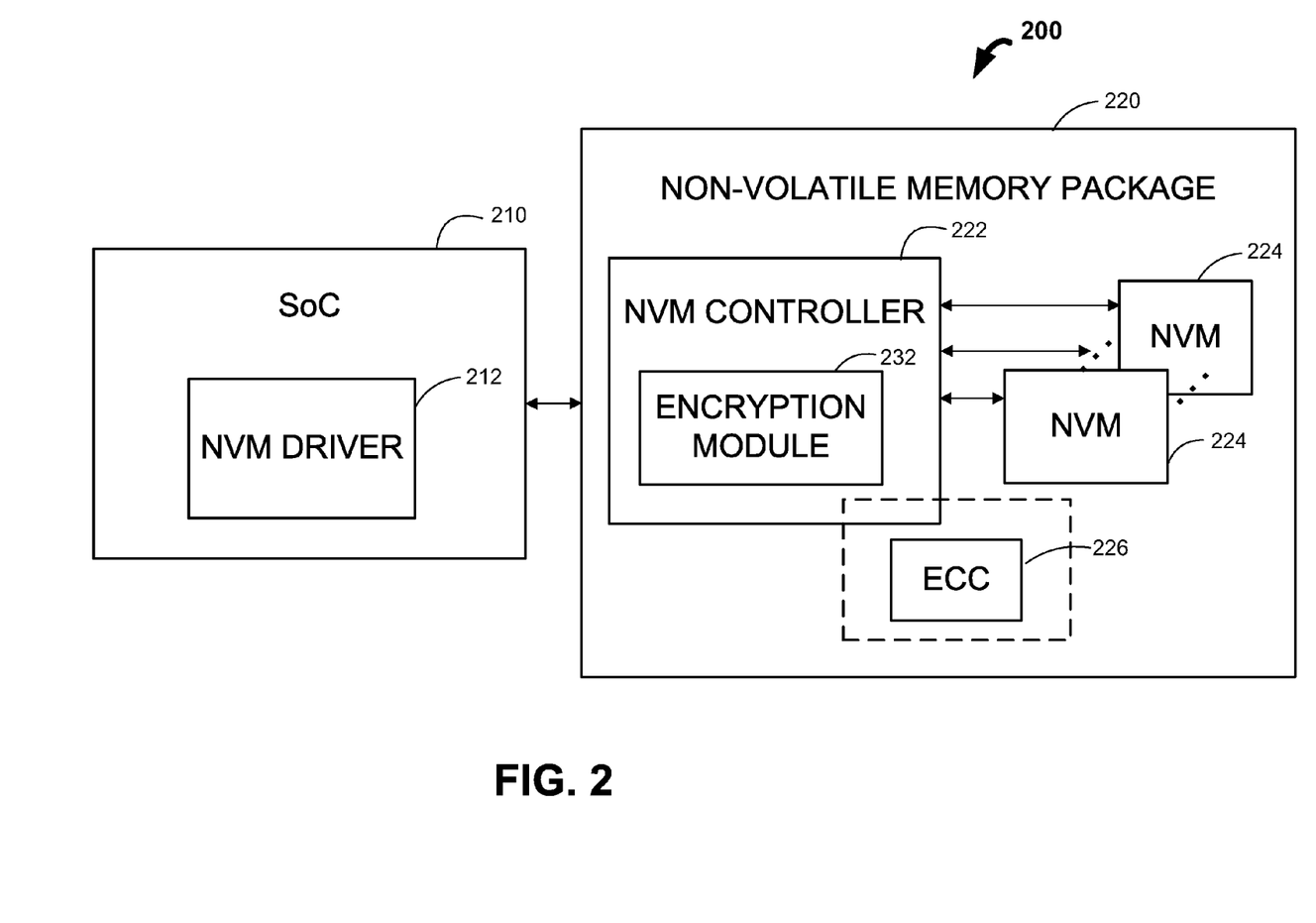
FIG. 2 is an illustrative block diagram of a system including a system-on-a-chip and a managed non-volatile memory package configured in accordance with various embodiments of the invention.

FIG. 2 shows a block diagram of system 200, which is an example of one embodiment of electronic device 100 of FIG. 1. System 200 can include SoC 210 and at least one non-volatile memory ("NVM") package 220. SoC 210 and optionally NVM package 220 can be implemented in any suitable host device or system, such as a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, or a laptop computer.

SoC 210 can include or operate in conjunction with any other components or circuitry capable of controlling various operations of system 200 (e.g., application-specific integrated circuits ("ASICs")). In a processor-based implementation, SoC 210 can execute firmware and software programs loaded into a memory implemented on the host (e.g., memory 114 of FIG. 1).

SoC 210 can perform any of the functions of SoC 110 of FIG. 1. For example, SoC 210 can execute NVM driver 212, which may provide vendor-specific and/or technology-specific instructions that enable SoC 210 to perform various memory management and access functions for non-volatile memory package 220. In some embodiments, NVM driver 212 may be implemented as a part of NVM interface 118 (FIG. 1).

NVM package 220 may be a managed NVM package. As used herein, a "managed NVM" may refer to a memory device or package that includes a NVM controller configured to perform at least one memory management function for a non-volatile memory. For example, as shown in FIG. 2, NVM controller 222 can perform memory management functions for any suitable number of NVM dies 224.

NVM controller 222 may include any suitable combination of processors, microprocessors, or hardware-based components (e.g., ASICs), and may include the same components as or different components from SoC 210. For example, NVM controller 222 may share the responsibility of managing and/or accessing the physical memory locations of NVM dies 224 with NVM driver 212. Alternatively, NVM controller 222 may perform substantially all of the management and access functions for NVM dies 224.

Memory management and access functions that may be performed by NVM controller 222 and/or SoC 210 for NVM dies 224 can include issuing read, write, or erase instructions and performing wear leveling, bad block management, garbage collection, logical-to-physical address mapping, SLC or MLC programming decisions, applying error correction or detection, and data queuing to set up program operations.

In some embodiments, NVM controller 222 can include an error correction code ("ECC") module 226 for detecting and correcting data errors (e.g., flipped bits). ECC module 226 is shown with a dashed-line box to indicate that its function can be implemented in different locations. In some embodiments, ECC module 226 can be implemented as a hardware component in NVM controller 222 or as a software component executed by NVM controller 222. In other embodiments, ECC module 226 can be a stand-alone module in NVM 220.

ECC module 226 can include any suitable number of ECC engines. The ECC engines can each employ one or more error correcting or error detecting codes, such as a Reed-Solomon ("RS") code, a Bose, Chaudhuri and Hocquenghem ("BCH") code, a cyclic redundancy check ("CRC") code, or any other suitable error correcting or detecting code. The ECC engines may be used to protect data that is stored in NVM dies 224, and therefore the type and strength of the ECC engines may be selected based on the properties and reliability of NVM dies 224.

Encryption module 232 can be or may include any hardware or software, or combination thereof, configured to perform encryption and decryption based on a suitable cipher. For example, encryption module 232 can be based on the Advanced Encryption Standard ("AES"), Data Encryption Standard ("DES"), or RSA. Encryption module 232 can provide security for sensitive data, such as personal information or billing information, stored on NVM dies 224 or transmitted/received to/from SoC 210. In addition to providing security, the encryption algorithm used by encryption module 232 may provide the added feature of whitening or randomizing the data it encrypts. As used herein, "data whitening" can refer to a process whereby a sequence of data is increasingly randomized in order to reduce reliability issues.

Encryption module 232 may therefore be directed to encrypt data even if that data is not sensitive, so that this data can be whitened prior to being written into NVM dies 224. This way, program-disturb and other reliability issues can be reduced.

Encryption module 232 can encrypt and decrypt data using one or more "encryption seeds" provided by NVM controller 222, which may be required by the encryption algorithm to perform encryption or decryption. In some embodiments, and particularly for AES-based encryption modules, the encryption seeds can include a key and an initialization vector ("IV"). To recover the original unencrypted data from encrypted data, the encryption seeds used for decryption may need to be the same as the seeds originally used for encryption. Various features are disclosed below in connection with FIG. 7 that illustrates various techniques a system can use to generate these encryption seeds.

In some embodiments, NVM controller 222 can direct encryption module 232 to encode data to be stored on NVM dies 224 or decode data retrieved from NVM dies 224. For example, NVM controller 222 can encode data by directing encryption module 232 to whiten data that will be stored on NVM dies 224.

As another example, NVM controller 222 can decode data by directing encryption module 232 to perform a suitable transform on data retrieved from NVM dies 224. Although encryption module 232 and NVM controller 222 are shown as separate modules, persons skilled in the art will appreciate that the functionalities of encryption module 232 can instead be implemented directly in NVM controller 222.

NVM dies 224 may be used to store information that needs to be retained when system 200 is powered down. As used herein, and depending on context, a "NVM" can refer to one or more of NVM dies in which data can be stored, a NVM controller, or a NVM package that includes a NVM controller and NVM dies.

As mentioned above, a block of a NVM (e.g., NVM 120 of FIG. 1 or one of NVM dies 224 of FIG. 2) may include an array of memory cells, where each memory cell can be a multi-level cell ("MLC"). In such a configuration, each memory cell can be capable of storing more than one bit of data.

For example, a 2-bit memory cell, which can include an upper page and a lower page, may store two bits of data. In particular, each of the upper and lower pages can be used to store a single bit. Thus, a 2-bit memory cell can be programmed in one of four states, where each state can correspond to a different threshold voltage range (e.g., $V_t$). The four states can be, for instance, a fully unprogrammed state, a partially unprogrammed state, a partially programmed state, and a fully programmed state.

Figure 3:
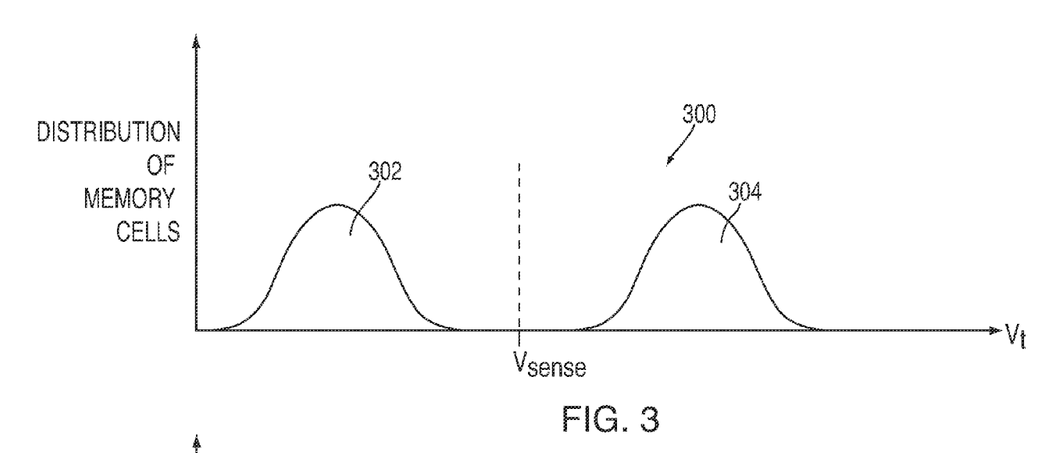
FIG. 3 is a graphical view of an illustrative graph of threshold voltages for lower page programming of multi-level cells ("MLCs") in accordance with various embodiments of the invention.

Referring now to FIG. 3, an illustrative graph 300 of threshold voltages for lower page programming of 2-bit memory cells is shown. In order to program a 2-bit memory cell, a lower page of the memory cell can be programmed first in order to induce charges in the memory cell. For instance, the memory cell can be charged or left uncharged to indicate a first bit value (e.g., a first bit value of '0' or '1').

In some embodiments, the lower page of the memory cell can be programmed by adjusting the amount of charge stored in a floating gate transistor of the memory cell. For example, when the transistor is charged, the threshold voltage of the memory cell may be relatively high. In contrast, when the transistor is uncharged, the threshold voltage of the memory cell may be relatively low. In the example shown in FIG. 3, for instance, memory cells that have relatively low threshold voltages can be indicated by distribution 302, and memory cells that have relatively high threshold voltages can be indicated by distribution 304.

Figure 4:
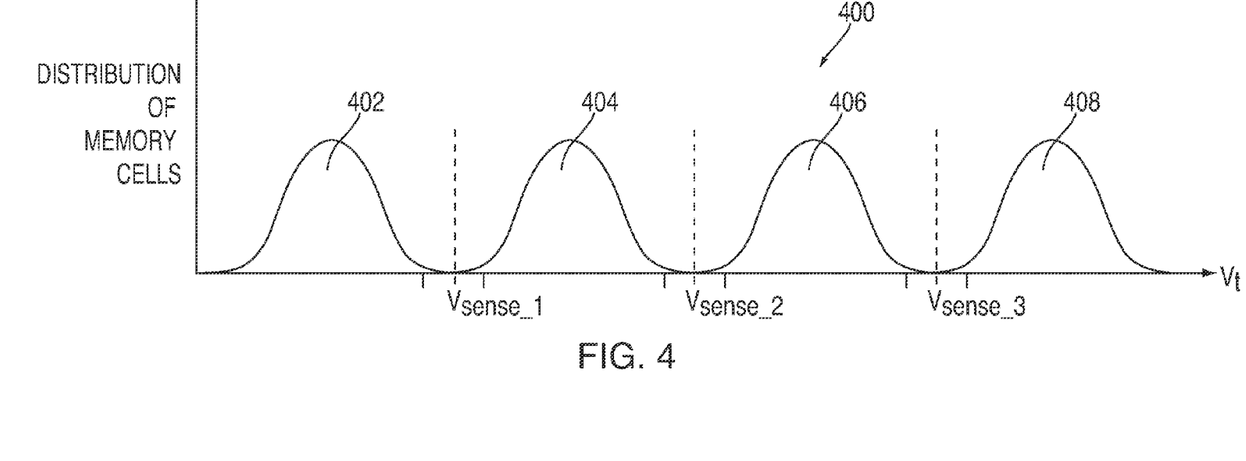
FIG. 4 is a graphical view of an illustrative graph of threshold voltages for upper page programming of MLCs in accordance with various embodiments of the invention.

After the lower page of a 2-bit memory cell has been programmed, an upper page of the 2-bit memory cell can be programmed in order to induce additional charges in the memory cell. For example, FIG. 4 shows an illustrative graph 400 of threshold voltages for upper page programming of 2-bit memory cells.

During upper page programming, a 2-bit memory cell can be further charged or left uncharged to indicate additional bit values. For instance, after upper page programming, a memory cell can indicate a pair of bit values (e.g., '11', '10', '01', or '00'). Each 2-bit pair can be associated with one of the four states of 2-bit memory cells. Table 1 provides the four states that can correspond to distributions 402-408 of FIG. 4.

TABLE 1

| Distribution | State |
|---|---|
| 402 | Fully unprogrammed |
| 404 | Partially unprogrammed |
| 406 | Partially programmed |
| 408 | Fully programmed |

As shown in FIG. 4, each state can correspond to a particular threshold voltage range. For example, the fully programmed state (e.g., distribution 408) can correspond to the highest threshold voltage range, and the fully unprogrammed state (e.g., distribution 402) can correspond to the lowest threshold voltage range.

In order to read a 2-bit memory cell, each of its lower and upper pages can be read. For example, referring now to both FIGS. 3 and 4, in order to read a lower page, a sensing voltage (e.g., $V_{sense}$ of FIG. 3) can be applied to a word line corresponding to the lower page. After the sensing voltage has been applied to the word line, data programmed in the lower page can be read out. As another example, in order to read an upper page, one or more sensing voltages (e.g., $V_{sense\_1}$, $V_{sense\_2}$, and/or $V_{sense\_3}$ of FIG. 4) may be applied to a word line corresponding to the upper page. After the one or more sensing voltages have been applied to the word line, data programmed in the upper page can be read out.

Problems can occur when a system attempts to read a multi-level memory cell that has not been properly programmed. For example, a power loss event may occur while a multi-level memory cell is being programmed that can cause flag bit corruption. This may in turn cause the device to transmit corrupted data in response to a read operation. As used herein, "corrupted data" can refer to data obtained from a memory location of a NVM that is actually data stored in a different memory location. For example, a system can erroneously read lower page data (e.g., data stored in a lower page of a memory cell) from an upper page of the memory cell. Hence, corrupted data can be either valid (e.g., data that passes ECC) or invalid data (e.g., data that fails ECC).

Figure 5:
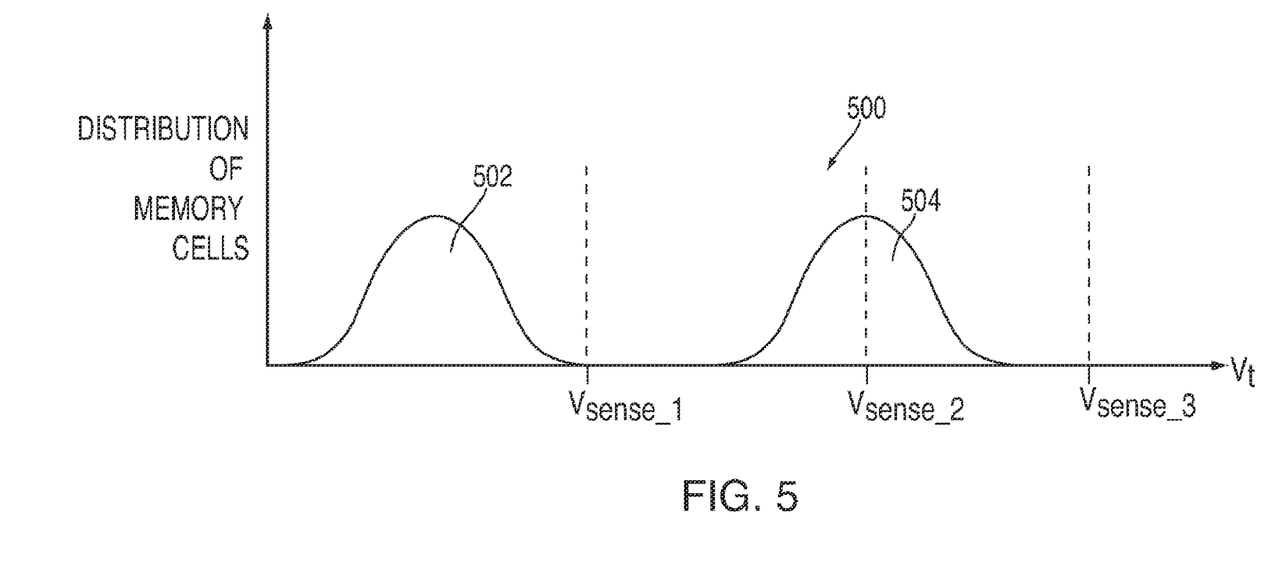
FIG. 5 is a graphical view of an illustrative graph of threshold voltages for MLCs that have not been properly programmed in accordance with various embodiments of the invention.

For example, FIG. 5 shows an illustrative graph 500 of threshold voltages for multi-level cells that have not been properly programmed. A power loss event may occur after the lower page of a 2-bit memory cell has been fully programmed, but before the upper page of the memory cell is fully programmed. Consequently, the resulting distributions of memory cells (e.g., distributions 502 and 504) may not resemble the normal distributions for properly programmed 2-bit memory cells (e.g., distributions 402-408 of FIG. 4). Persons skilled in the art will appreciate that distributions 502 and 504 are merely illustrative. In particular, the actual distributions may depend on one or more factors, such as, for example, the architecture of a block and/or when the power loss event occurred during the programming of a 2-bit memory cell.

In some cases, the power loss event may cause a system to lose information previously stored in memory, which would have allowed the system to identify the last programmed memory cell. Thus, when power is later restored, the system may inadvertently attempt to read data from the last programmed memory cell.

As mentioned above, in order to read the memory cell, the system can first read the lower page of the memory cell, and then attempt to read the upper page of the memory cell. In reading the upper page, for instance, the system may apply one or more sensing voltages (e.g., $V_{sense\_1}$, $V_{sense\_2}$, and/or $V_{sense\_3}$) to a word line corresponding to the upper page. Unfortunately, because the upper page of the memory cell is improperly programmed (e.g., unprogrammed or only partially programmed), the system may be unable to sense the proper programming state of the memory cell. In some cases, the data that is read from the upper page may be data that is actually stored in the lower page of the memory cell. Accordingly, the data that is obtained can be considered undefined and corrupted.

Moreover, because the corrupted data may actually be valid data stored in another memory location, error correction coding ("ECC") applied to the data may not reveal the data corruption. In conventional systems, in order to assist a NVM controller (e.g., NVM controller 222 of FIG. 2) with identifying the last programmed memory cell, a state bit can be recorded in the NVM. In particular, the state bit can be programmed to indicate when both the lower and upper pages of a memory cell have been fully programmed. Thus, based on the state bit, the NVM controller can determine that a last programmed memory cell has not been fully programmed when an attempt is made to read the memory cell. Responsive to this determination, the NVM controller can override data read from the upper page (e.g., which may be stored in a data buffer). For example, the NVM controller can multiplex 0xFF values to the data, and transmit the multiplexed data indicating that the upper page is an erased page.

In some power loss scenarios, however, the value of the state bit can become unreliable, which can cause the NVM controller to inadvertently transmit corrupted data from an improperly programmed upper page. In these scenarios, the state bit may have already been programmed to indicate that the upper page was fully programmed, when a power loss event actually interrupted the programming of the upper page. That is, the time for programming the state bit (e.g., to change the state bit from an unprogrammed value of 1 to a programmed value of 0) may be shorter than the time required to program a memory cell. Consequently, based on the state bit, the NVM controller may unintentionally transmit corrupted data to a SoC (e.g., SoC 110 of FIG. 1 or SoC 210 of FIG. 2). Problems may occur when the SoC then attempts to use the corrupted data.

Accordingly, a number of approaches can be used to verify that data read from an upper page of a memory cell is in fact upper page data (e.g., data that has been programmed in the upper page) and not corrupted data. If a determination is made that the data read is corrupted data, the data can be treated as if it were uncorrectable ECC ("uECC") data. Persons skilled in the art will appreciate that the approaches described below are merely illustrative, and that any suitable approach can be used to verify that data read from an upper page is upper page data.

Figure 6:
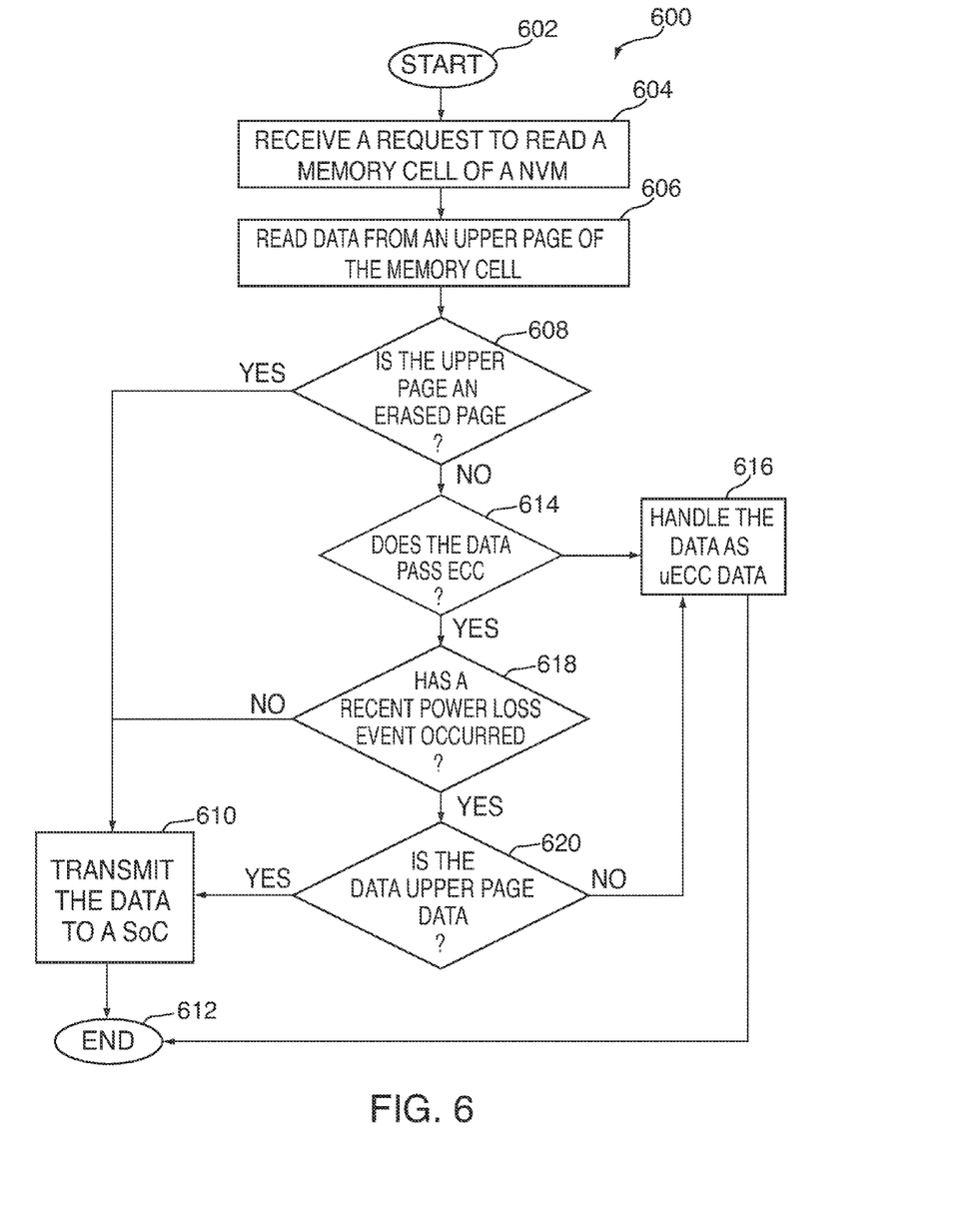
FIG. 6 is a flowchart of an illustrative process for handling data read from an upper page of a MLC in accordance with various embodiments of the invention.

For example, referring now to FIG. 6, a flowchart of illustrative process 600 is shown for handling data read from an upper page of a multi-level memory cell. The steps of process 600 can be executed by a NVM controller, such as NVM controller 222 of FIG. 2, or by any component or combination of components of an electronic device or system (e.g., electronic device 100 of FIG. 1 or system 200 of FIG. 2). However, for purposes of clarity and not of limitation, process 600 will be described as being performed by a NVM controller.

Process 600 can begin at step 602. At step 604, the NVM controller can receive a request to read a memory cell of a NVM (e.g., NVM 120 of FIG. 1 or NVM dies 224 of FIG. 2).

In some cases, the NVM controller may begin by reading data from a lower page of the memory cell.

At step 606, the NVM controller can read data from an upper page of the memory cell. Then, at step 608, the NVM controller can determine if the upper page is an erased page.

If, at step 608, the NVM controller determines that the upper page is an erased page, process 600 can move to step 610. For example, the NVM controller can determine that the upper page is an erased page by determining that data read from the upper page includes erased values (e.g., 0xFF values). As another example, based on a state bit, the NVM controller can determine that the upper page has not been fully programmed. As a result, the NVM controller can determine that the upper page is an erased page, and can thus multiplex 0xFF values to data read from the upper page.

At step 610, the NVM controller can transmit the data to a SoC (e.g., SoC 110 of FIG. 1 or SoC 210 of FIG. 2). That is, the NVM controller can transmit data to the SoC indicating that the upper page is an erased page. Process 600 may then end at step 612.

Referring back to step 608, if the NVM controller determines that the upper page is not an erased page, process 600 may move to step 614. At step 614, the NVM controller can determine if the data passes ECC. For example, an ECC module (e.g., ECC module 226 of FIG. 2) can be used to detect and correct for data errors in the data.

If, at step 614, the NVM controller determines that the data does not pass ECC, process 600 may move to step 616. For example, if the number of errors in the data exceeds a pre-determined threshold, the ECC module may be unable to correct the data errors. This type of data may sometimes be referred to as "uncorrectable ECC" ("uECC") data.

Thus, at step 616, the NVM controller can handle the data as uECC data. For example, the NVM controller can ignore both the data and metadata read from the page, and transmit suitable information to the SoC. For instance, the NVM controller can transmit information indicating that data stored in the corresponding block or super block needs to be moved, and that the block or the super block needs to be erased. Process 600 may then end at step 612.

Referring back to step 614, if the NVM controller instead determines that the data passes ECC, process 600 may move to step 618. At step 618, the NVM controller can determine if a recent power loss event has occurred. In some embodiments, the NVM controller can make this determination in order to reduce the run-time impact of detecting whether the data read from the upper page is upper page data.

If, at step 618, the NVM controller determines that a recent power loss event has not occurred, process 600 can move to step 610. The NVM controller can thus bypass detecting if the data read from the upper page is upper page data, and determine that the data is uncorrupted data. At step 610, the NVM controller can transmit the data to the SoC.

Referring back to step 618, if the NVM controller instead determines that a recent power loss event has occurred, process 600 may move to step 620. At step 620, the NVM controller can detect if the data is upper page data.

If, at step 620, the NVM controller detects that the data is upper page data, process 600 may move to step 610. For example, the NVM controller can determine that the data is uncorrupted data that is stored in the upper page. At step 610, the NVM controller can transmit the data to the SoC.

If, at step 620, the NVM controller detects that the data is not upper page data, process 600 may move to step 616. For example, the NVM controller can determine that the data is corrupted data that is stored in a different memory location of the NVM (e.g., a lower page of the memory cell). Thus, at step 616, the NVM controller can handle the data as uECC data.

As mentioned above, a NVM controller can use any suitable technique(s) to detect whether data read from an upper page of a memory cell is corrupted. In some embodiments, the NVM controller can direct an encryption module to perform a transform on metadata obtained from an upper page of a memory cell, where an input of the transform can be based at least in part on a physical page address of the upper page. As used herein, "metadata" can include any suitable type of memory management data generated by a NVM driver (e.g., NVM driver 212 of FIG. 2), which can be used to manage the storage of user data. In some cases, the metadata can be stored along with user data in the upper page.

After the transform has been performed on the obtained metadata, the NVM controller can determine whether an output of the transform corresponds to one or more excepted outputs (e.g., by performing range checks or checking whether specific portions of the metadata contain pre-determined values). The NVM controller can use any suitable approach to determine whether the output of the transform corresponds to one or more expected outputs, as discussed in more detail below in connection with FIG. 7.

Such an approach can leverage metadata that is already being stored in the NVM. In these embodiments, no changes to the metadata and/or user data are required in order to categorize data stored in a page as upper page data or lower page data. Instead, the system can categorize data by encoding or whitening existing metadata using at least a portion of the physical page address of a page.

Figure 7:
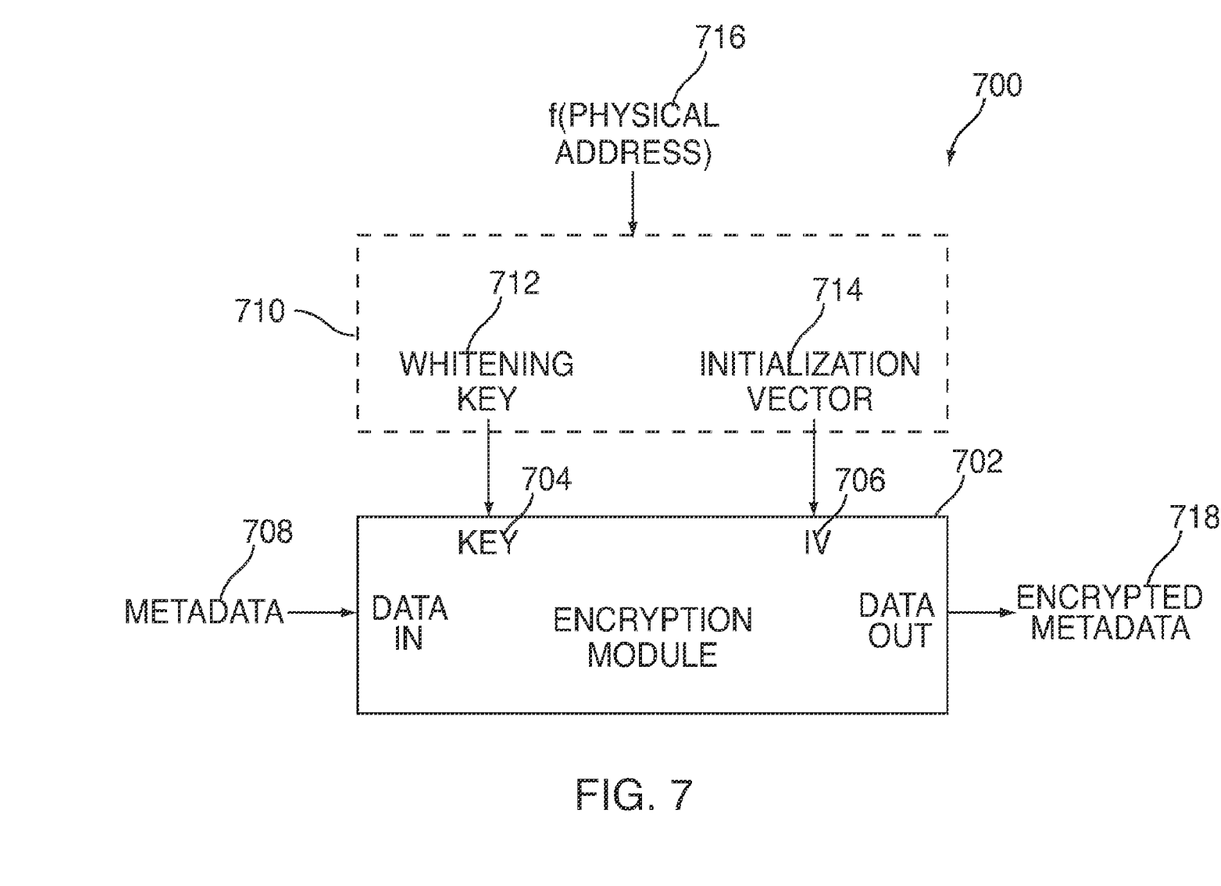
FIG. 7 is a schematic view of a portion of a NVM controller implemented on a non-volatile memory package and configured in accordance with various embodiments of the invention.

For example, turning now to FIG. 7, a schematic view of a portion of NVM controller 700 is shown. NVM controller 700 can be a more detailed view of NVM controller 222 (FIG. 2) or can be a completely different implementation of a NVM controller. As shown in FIG. 7, NVM controller 700 can include encryption module 702, which can be the same as or substantially similar to encryption module 232 (FIG. 2). For example, in some embodiments, encryption module 702 can be or can include an AES engine, which may have a key input 704 and an initialization vector ("IV") input 706.

Thus, for each page of a memory cell (e.g., each of the lower and upper pages of a memory cell), NVM controller 700 can determine a physical page address corresponding to the page. In addition, NVM controller 700 can compute metadata 708 corresponding to user data to be stored in the page. NVM controller 700 can then direct encryption module 702 to encrypt metadata 708 using encryption seed 710, which can be based at least in part on the physical page address of the page.

For example, as shown in FIG. 7, encryption seed 710 can include whitening key 712 and IV 714, where whitening key 712 and/or IV 714 can be generated based at least in part on the physical page address (e.g., based on a function of physical page address 716). After metadata 708 has been encrypted by encryption module 702, NVM controller 700 can program encrypted metadata 718 into the page.

When an upper page that has been encrypted using this technique is read at a later time, NVM controller 700 can direct encryption module 702 to perform metadata decryption on the encrypted metadata that is stored in the page. For example, encryption module 702 can decrypt the encrypted metadata using an encryption seed that may be the same as the seed originally used for encryption (e.g., the encryption seed can be based at least in part on the physical page address of the upper page). For instance, encryption module 702 can generate at least one of a whitening key and an IV based at least in part on the physical page address of the upper page. Encryption module 702 can then obtain an output of the metadata decryption by decrypting the encrypted metadata using the whitening key and the IV.

In some embodiments, an encryption seed (e.g., encryption seed 710) can be selected such that if encrypted metadata 718 were later decrypted with the wrong encryption seed, the output of the metadata decryption can include one or more bits of invalid data that are easily detectable by NVM controller 700. For example, one or more state bits may be set to unexpected values.

As another example, portions of the metadata (e.g., page type fields or reserved fields) that should always be within a certain expected range may have out-of-range values after the decryption. For instance, a logical block address ("LBA") should be within the range of a drive's capacity. However, after decrypting with the wrong encryption seed, one or more upper bits of a logical block address ("LBA") included in the decrypted metadata (which are otherwise unused) may have non-zero values.

Figure 8:
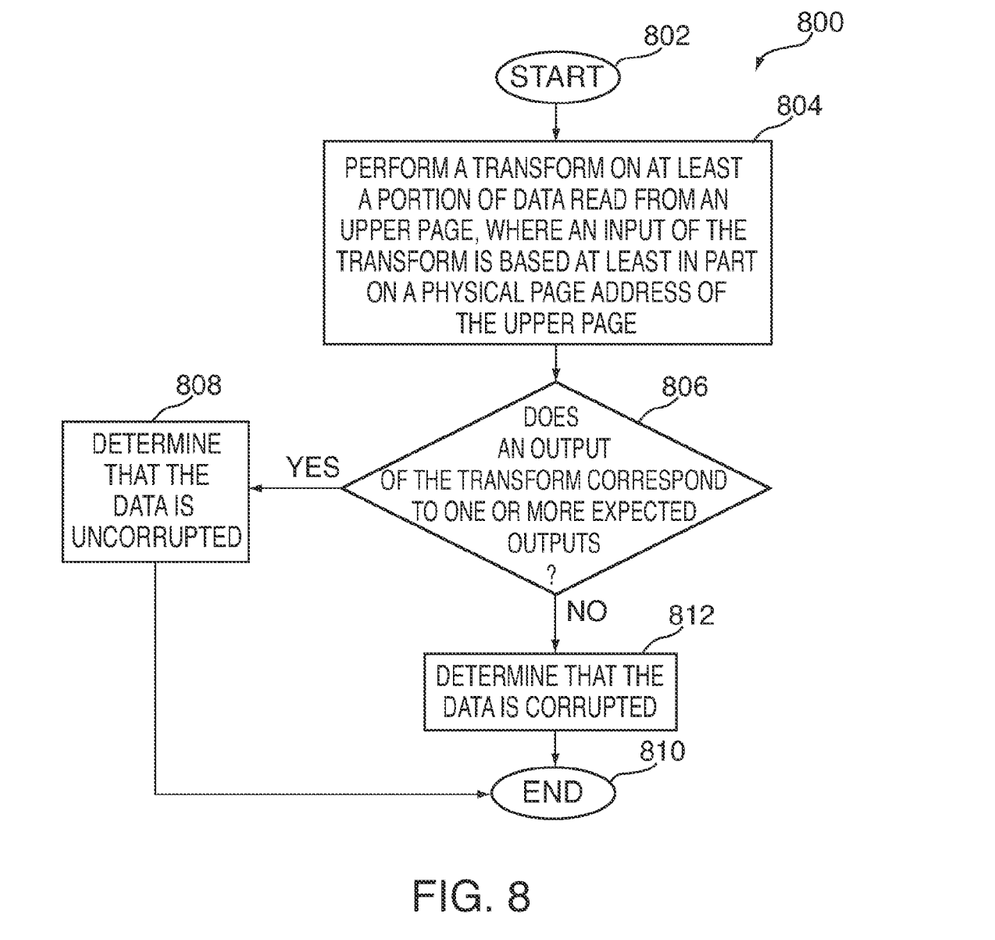
FIG. 8 is a flowchart of an illustrative process for performing a transform on data read from an upper page of a MLC in accordance with various embodiments of the invention.

Referring now to FIG. 8, a flowchart of illustrative process 800 is shown for performing a transform on data read from an upper page of a memory cell. The steps of process 800 can be executed by a NVM controller (e.g., NVM controller 222 of FIG. 2 or NVM controller 700 of FIG. 7), an encryption module (e.g., encryption module 232 of FIG. 2 or encryption module 702 of FIG. 7), or by any other component or combination of components of an electronic device or system (e.g., electronic device 100 of FIG. 1 or system 200 of FIG. 2). In some embodiments, process 800 can be a more detailed view of step 620 of process 600 of FIG. 6.

Process 800 can begin at step 802, where a NVM controller may read data from an upper page of a memory cell. In some cases, the NVM controller may determine that the data passes ECC.

At step 804, an encryption module can perform a transform on at least a portion of the data read from the upper page, where an input of the transform is based at least in part on a physical page address of the upper page. For example, the portion of the data can include encrypted metadata. The encryption module can thus perform metadata decryption on the encrypted metadata.

At step 806, an NVM controller can determine if an output of the transform corresponds to one or more expected outputs. For example, the NVM controller can determine if an output of the metadata decryption corresponds to one or more expected outputs. For instance, the NVM controller can perform range checks or determine whether specific portions of the metadata contain pre-determined values. In some cases, the NVM controller can determine if the output includes one or more unexpected values (e.g., unexpected values in a LBA or one or more out-of-range values).

If, at step 806, the NVM controller determines that the output corresponds to one or more expected outputs, process 800 may move to step 808. For example, the NVM controller can determine that the output does not include unexpected values in a LBA or one or more out-of-range values.

At step 808, the NVM controller can determine that the data is uncorrupted. The NVM controller can then proceed to transmit the data to a SoC (e.g., SoC 110 of FIG. 1 or SoC 210 of FIG. 2). This step may be the same as or similar to step 610 of process 600 (FIG. 6). Process 800 then ends at step 810.

If, at step 806, the NVM controller instead determines that the output does not correspond to one or more expected outputs, process 800 may move to step 812. For example, the NVM controller can determine that the output includes unexpected values in the LBA or one or more out-of-range values.

At step 812, the NVM controller can determine that the data is corrupted. For example, the NVM controller can determine that the data corresponds to data stored in a lower page of the memory cell. As a result, the NVM controller can be configured to handle the data as uECC data. This step may be the same as or similar to step 616 of process 600 (FIG. 6). Process 800 may then end at step 810.

In some embodiments, a NVM controller can explicitly allocate space in the metadata of a page to identify whether the page is a lower page or an upper page. That is, the NVM controller can embed a value in the metadata, where the value can be derived from the physical page address of the page. In one embodiment, for example, the NVM controller can program at least a portion of the physical page address into one or more metadata fields.

For instance, for each page of a memory cell that needs to be programmed, the NVM controller can determine a physical page address corresponding to the page. The NVM controller can then compute one or more metadata fields corresponding to user data to be stored in the page, where the one or more metadata fields can include at least a portion of the physical address (e.g., physical page address). For example, the NVM controller can allocate space in one or more metadata fields for storing the entire physical page address (e.g., 32-bits of data). Alternatively, the NVM controller can allocate space in one or more metadata fields for storing only a subset of the physical page address. After computing the one or more metadata fields, the NVM controller can program the one or more metadata fields into the page.

In another embodiment, if the NVM controller is able to determine whether a page is a lower or upper page based on its physical page address, the controller may only need to allocate a small amount of space in the metadata for page identification. For example, the NVM controller can receive a request to program user data to a memory cell. Responsive to this request, for each page of the memory cell, the NVM controller can set at least one bit of metadata to a pre-determined value. The pre-determined value can be based at least in part on a physical address of the page.

For instance, the pre-determined value can indicate whether the page is a lower page or an upper page of the NVM. As an example, the pre-determined value can have a value of one to indicate that the page is an upper page and a value of zero to indicate that the page is a lower page.

The NVM controller can use any suitable approach to derive the pre-determined value such as, for example, by calculating a parity of the page number (or physical page address) of the page. The NVM controller can thus set a single bit of the metadata to the calculated parity value.

After setting at least one bit of the metadata to the pre-determined value, the NVM controller can direct an encryption module to encode the metadata. In some embodiments, after encoding the metadata, the NVM controller can apply ECC to both the user data and the encoded metadata. The NVM controller can then program the user data and the encoded metadata into the page.

When an upper page that has been encoded using this technique is read at a later time, the NVM controller can direct an encryption module to perform metadata decoding. For example, referring now to FIG. 9, a flowchart of illustrative process 900 is shown for decoding encoded metadata from an upper page of a memory cell. The steps of process 900 can be executed by a NVM controller (e.g., NVM controller 222 of FIG. 2 or NVM controller 700 of FIG. 7), an encryption module (e.g., encryption module 232 of FIG. 2 or encryption module 702 of FIG. 7), or by any other component or combination of components of an electronic device or system (e.g., electronic device 100 of FIG. 1 or system 200 of FIG. 2). In some embodiments, process 900 can be a more detailed view of step 620 of process 600 (FIG. 6).

Figure 9:
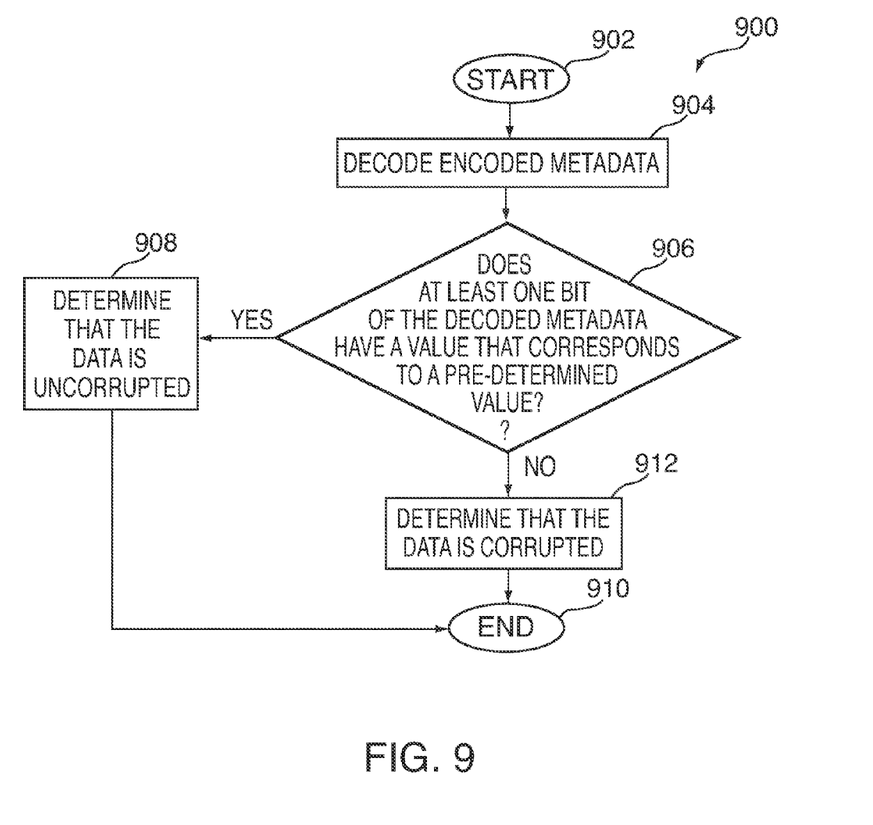
FIG. 9 is a flowchart of an illustrative process for decoding metadata obtained from an upper page of a MLC in accordance with various embodiments of the invention.

Process 900 can begin at step 902, where a NVM controller may have received a request to read a memory cell. Responsive to this request, the NVM controller can read data from an upper page of a memory cell, where at least a portion of the data includes encoded metadata. In some cases, the NVM controller may determine that the data passes ECC.

At step 904, the NVM controller can direct an encryption module to decode the encoded metadata. Process 900 may then move to step 906.

At step 906, the NVM controller can determine if at least one bit of the decoded metadata has a value that corresponds to a pre-determined value. For example, the at least one bit can encode whether the data corresponds to data stored in an upper page or a lower page. This can provide a dense encoding for determining where data is being stored.

If, at step 906, the NVM controller determines that the at least one bit of the decoded metadata has a value that corresponds to the pre-determined value, process 900 may move to step 908. At step 908, the NVM controller can determine that the data is uncorrupted. The NVM controller can then proceed to transmit the data to a SoC (e.g., SoC 110 of FIG. 1 or SoC 210 of FIG. 2). This step may be the same as or similar to step 610 of process 600 (FIG. 6). Process 900 then ends at step 910.

If, at step 906, the NVM controller instead determines that the at least one bit of the decoded metadata has a value that does not correspond to the pre-determined value, process 900 may move to step 912. At step 912, the NVM controller can determine that the data is corrupted. For example, the NVM controller can determine that the data corresponds to data stored in a lower page of the memory cell. As a result, the NVM controller can be configured to handle the data as uECC data. This step may be the same as or similar to step 616 of process 600 (FIG. 6). Process 900 may then end at step 910.

It should be understood that the processes of FIGS. 6, 8, and 9 are merely illustrative. Any steps can be added, modified, combined, or rearranged, and any additional steps may be added, without departing from the scope of the invention.

The described embodiments of the invention are presented for the purpose of illustration and not of limitation.

What is claimed is:

1. A method for reading data from a non-volatile memory ("NVM"), the NVM comprising blocks, each block comprising an array of memory cells, the method comprising:
   receiving a request to read a memory cell of the NVM;
   reading data from an upper page of the memory cell;
   determining that the data passes error correction coding ("ECC");
   detecting if the data is upper page data; and
   in response to detecting that the data is not upper page data, determining the data is corrupted data that is stored in a lower page of the memory cell.

2. The method of claim 1, wherein the determining the data is corrupted data further comprises handling the data as uncorrectable ECC data.

3. The method of claim 1, further comprising:
   in response to detecting that the data is upper page data, determining the data is uncorrupted data that is stored in the upper page; and
   transmitting the data to a system-on-a-chip.

4. The method of claim 1, wherein a portion of the data comprises encrypted metadata that is encrypted using an encryption seed based at least in part on a physical page address of the upper page, and wherein the detecting comprises:
   performing metadata decryption on the encrypted metadata; and
   determining if an output of the metadata decryption corresponds to at least one expected output.

5. The method of claim 4, wherein the performing further comprises:
   generating the encryption seed based at least in part on the physical page address; and
   obtaining the output by decrypting the encrypted metadata using the encryption seed.

6. The method of claim 1, wherein a portion of the data comprises encoded metadata, and wherein the detecting further comprises:
   decoding the encoded metadata; and
   determining if at least one bit of the decoded metadata has a value that corresponds to a pre-determined value, wherein the at least one bit encodes whether the data corresponds to data stored in an upper page or a lower page.

7. The method of claim 1, wherein the detecting further comprises:
   determining if a recent power loss event has occurred; and
   in response to determining that a recent power loss event has occurred, detecting if the data is upper page data.

8. The method of claim 7, wherein the detecting further comprises:
   in response to determining that a recent power loss event has not occurred, bypass detecting if the data is upper page data;
   determining the data is uncorrupted data; and
   transmitting the data to a system-on-a-chip.

9. A system comprising:
   non-volatile memory ("NVM") comprising a plurality of blocks, each block comprising an array of memory cells, wherein each memory cell of the array of memory cells is a multi-level cell ("MLC");
   an encryption module; and
   a NVM controller operative to:
     receive a request to read a memory cell of the plurality of memory cells;
     read data from an upper page of the memory cell;
     determine that the data passes error correction coding ("ECC");
     direct the encryption module to perform a transform on at least a portion of the data, wherein an input of the transform is based at least in part on a physical page address of the upper page; and
     determine if an output of the transform corresponds to at least one expected output.

10. The system of claim 9, wherein the NVM controller is further operative to determine if the output of the transform comprises at least one out-of-range value.

11. The system of claim 9, further comprising a system-on-a-chip ("SoC"), and wherein in response to determining that the output of the transform corresponds to the at least one expected output, the NVM controller is further operative to:
    determine that the data is uncorrupted; and
    transmit the data to the SoC.

12. The system of claim 9, wherein in response to determining that the output of the transform does not correspond to the at least one expected output, the NVM controller is further operative to handle the data as uncorrectable ECC data.

13. The system of claim 9, wherein the at least a portion of the data comprises encrypted metadata, and wherein the encryption module is operative to decrypt the encrypted metadata using an encryption seed based at least in part on the physical page address of the upper page.

14. The system of claim 13, wherein the encryption module is operative to:
    generate at least one of a whitening key and an initialization vector based at least in part on the physical page address of the upper page; and
    decrypt the encrypted metadata using the whitening key and the initialization vector.

15. The system of claim 9, wherein each memory cell of the array of memory cells comprises at least two pages, and wherein the NVM controller is operative to, for each page of a memory cell:
    determine a physical page address corresponding to the page;
    compute metadata corresponding to user data stored in the page;
    direct the encryption module to encrypt the metadata using an encryption seed based at least in part on the physical page address; and
    program the encrypted metadata into the page.

16. The system of claim 15, wherein the encryption seed comprises a whitening key and an initialization vector, and wherein at least one of the whitening key and the initialization vector is generated based at least in part on the physical page address.

17. The system of claim 16, wherein at least one of the whitening key and the initialization vector is based on a function of the physical page address.

18. Apparatus for detecting corrupted data in a non-volatile memory, the apparatus comprising:
    non-volatile memory ("NVM") comprising a plurality of blocks, each block comprising an array of memory cells, wherein each memory cell comprises an upper page and a lower page;
    an encryption module; and
    a NVM controller operative to:
        receive a request to program user data to a memory cell;
        for each page of the memory cell, set at least one bit of metadata to a pre-determined value, wherein the pre-determined value is based at least in part on a physical address of the page; and
        for each page of the memory cell, direct the encryption module to encode the metadata.

19. The apparatus of claim 18, wherein the pre-determined value indicates whether a page is a lower page or an upper page of the NVM.

20. The apparatus of claim 18, wherein the NVM controller is operative to, for each page of the memory cell, derive the pre-determined value by calculating a parity of a page number of the page.

21. The apparatus of claim 18, wherein the NVM controller is operative to, for each page of the memory cell:
    apply error correction coding ("ECC") to the user data and the encoded metadata; and
    program the user data and the encoded metadata into the page.

22. The apparatus of claim 21, wherein the NVM controller is operative to:
    receive a request to read the memory cell;
    read data from an upper page of the memory cell, wherein at least a portion of the data comprises encoded metadata;
    determine that the data passes ECC;
    direct the encryption module to decode the encoded metadata; and
    determine if at least one bit of the decoded metadata has a value that corresponds to a pre-determined value.

23. The apparatus of claim 22, further comprising a system-on-a-chip ("SoC"), and wherein in response to determining that the at least one bit of the decoded metadata has a value that corresponds to the pre-determined value, the NVM controller is operative to:
    determine that the data is uncorrupted; and
    transmit the data to the SoC.

24. The apparatus of claim 22, wherein in response to determining that the at least one bit of the decoded metadata has a value that does not correspond to the pre-determined value, the NVM controller is operative to:
    determine that the data corresponds to data stored in a lower page of the memory cell; and
    handle the data as uncorrectable ECC data.

25. The apparatus of claim 18, wherein the NVM controller is operative to, for each page of the memory cell:
    determine a physical page address corresponding to the page;
    compute at least one metadata field corresponding to the user data, wherein the at least one metadata field comprises at least a portion of the physical address; and
    program the at least one metadata field into the page.

* * * * *